United States Patent [19]

Yoshizawa et al.

[11] Patent Number: 5,006,795
[45] Date of Patent: Apr. 9, 1991

[54] CHARGED BEAM RADIATION APPARATUS

[75] Inventors: Masahiro Yoshizawa; Akira Kikuchi, both of Kanagawa; Kou Wada, Tokyo; Minpei Fujinami, Tokyo; Nobuo Shimazu, Tokyo, all of Japan

[73] Assignee: Nippon Telephone and Telegraph Public Corporation, Japan

[21] Appl. No.: 878,015

[22] Filed: Jun. 24, 1986

[30] Foreign Application Priority Data

| Jun. 24, 1985 | [JP] | Japan | 60-136147 |
| Jun. 24, 1985 | [JP] | Japan | 60-136148 |
| Aug. 5, 1985 | [JP] | Japan | 60-171028 |

[51] Int. Cl.$^5$ .................. G01B 15/00; G01R 31/26
[52] U.S. Cl. ........................ 324/158 R; 250/310; 250/311; 250/492.2
[58] Field of Search ............ 324/158 R, 73 PC; 250/310, 311, 492.2

[56] References Cited

U.S. PATENT DOCUMENTS

| 3,531,716 | 9/1970 | Tarui et al. | 324/158 R X |
| 4,415,851 | 11/1983 | Langner et al. | 324/158 R X |
| 4,417,203 | 11/1983 | Pfeiffer et al. | 324/158 R X |
| 4,567,364 | 1/1986 | Kano et al. | 250/310 X |
| 4,573,008 | 2/1986 | Lischke | 324/158 R |
| 4,600,839 | 7/1986 | Ichihashi et al. | 250/310 |
| 4,621,232 | 11/1986 | Chang et al. | 324/158 R |

FOREIGN PATENT DOCUMENTS

| 58-214259 | 12/1983 | Japan . |
| 59-761 | 1/1984 | Japan . |

Primary Examiner—Jerry Smith
Assistant Examiner—Stephen M. Baker
Attorney, Agent, or Firm—Remy J. VanOphem

[57] ABSTRACT

A charged beam radiation apparatus includes an auxiliary charged beam emitting mechanism, a main charged beam emitting mechanism, a secondary electron detector, and a computer as a controller. The auxiliary charged beam emitting mechanism emits an auxiliary charged beam of a given acceleration voltage onto a predetermined portion of an electronic device to be measured. The main charged beam emitting mechanism emits a main charged beam of an acceleration voltage lower than that of the auxiliary charged beam onto the predetermined portion and the vicinity of the predetermined portion. The secondary electron detector detects secondary electrons generated from a portion irradiated by the main charged beam. The controller measures a change in a secondary electron signal from the secondary electron detector.

23 Claims, 15 Drawing Sheets

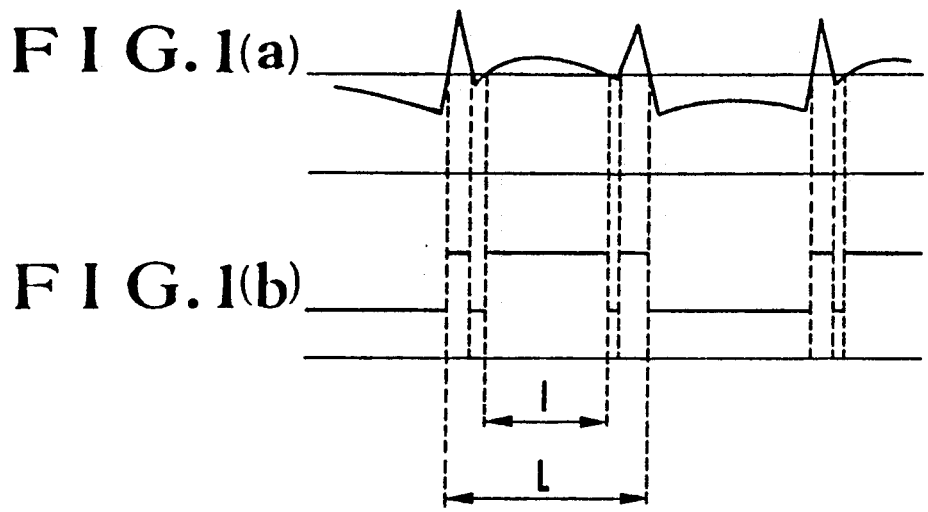
F I G. 1(a)
F I G. 1(b)
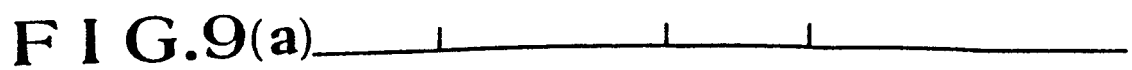
F I G. 9(a)
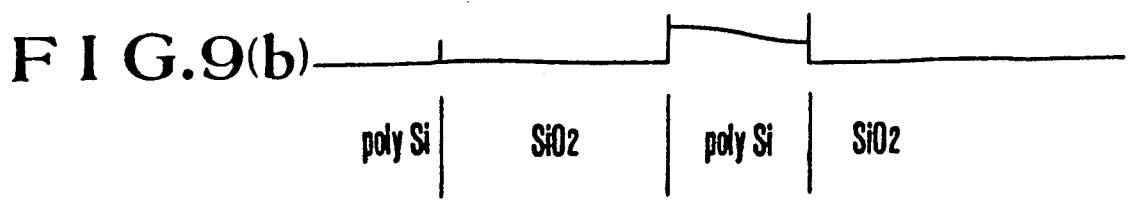
F I G. 9(b)

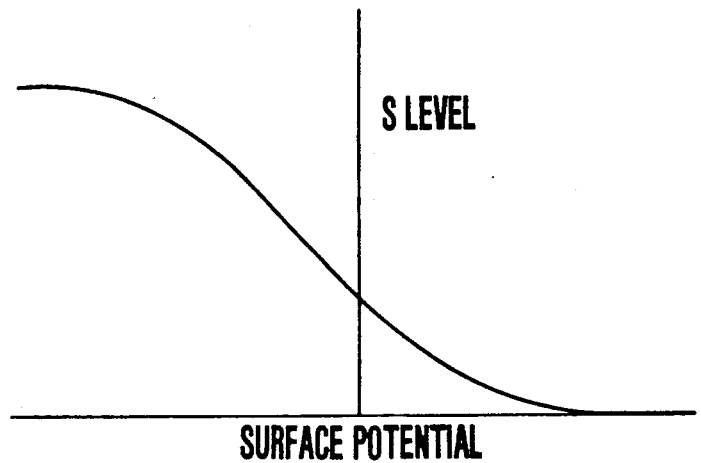
FIG.11
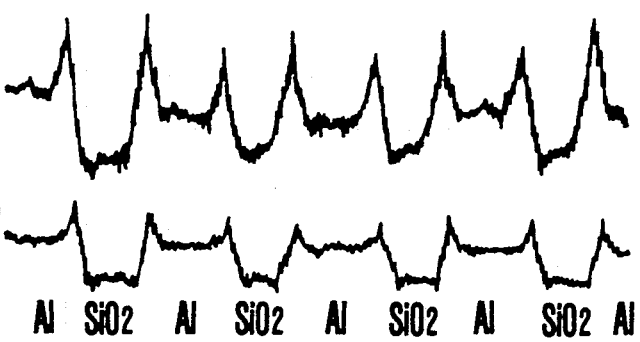
FIG.12(a)
FIG.12(b)
FIG.12(c)
FIG.12(d)

FIG.14(a)
FIG.14(b)
FIG.14(c)
SiO2　　RESIST　　SiO2
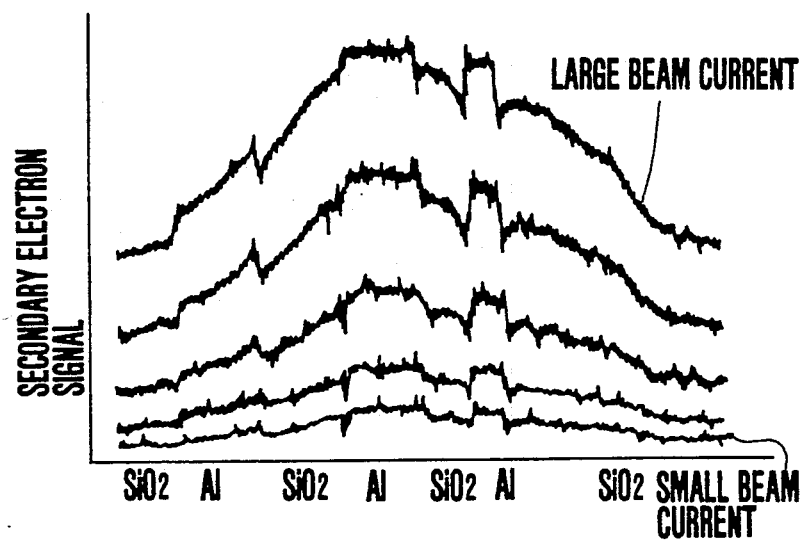
FIG.16(a)
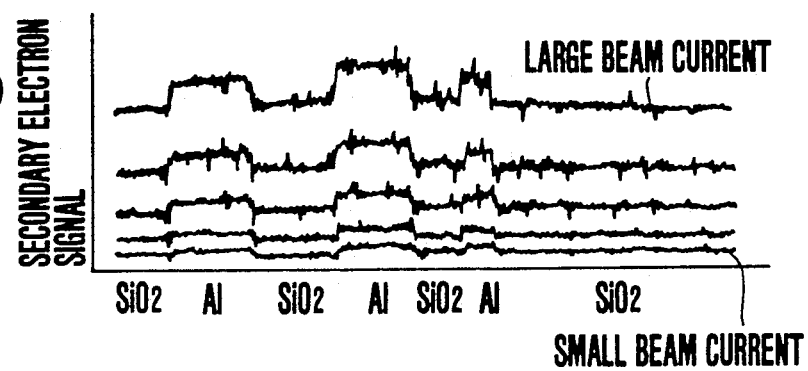
FIG.16(b)

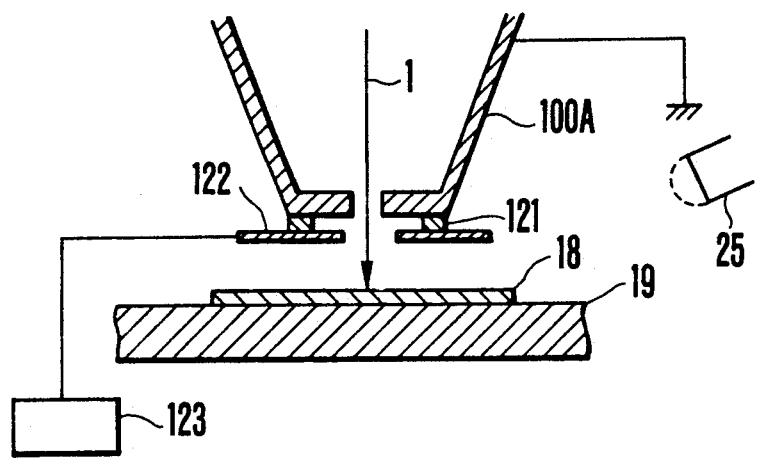
F I G. 18(a)
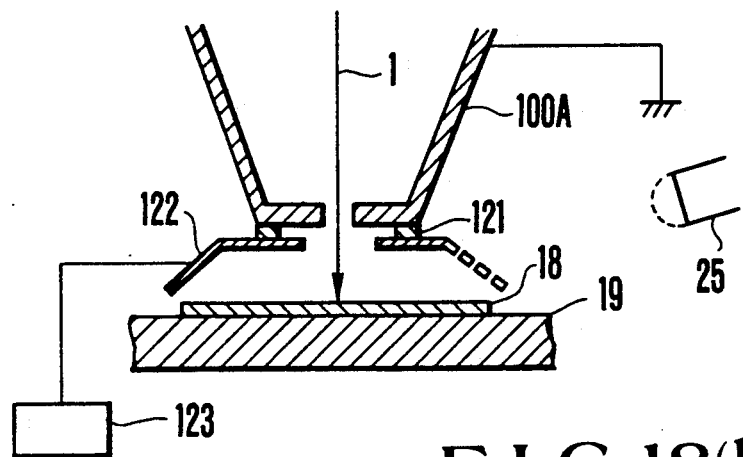
F I G. 18(b)

CHARGED BEAM RADIATION APPARATUS

BACKGROUND OF THE INVENTION

The present invention relates to a charged beam radiation apparatus and, more particularly, to a charged beam radiation apparatus such as a scanning electron microscope used in a system for measuring, with a charged beam, micropattern sizes of electronic devices such as VLSIs during their fabrication, or in a system for testing these devices in a noncontact manner.

It is very important to control sizes of resist films and wiring layers in the VLSI fabrication process. Along with the development of micropatterning, a system for measuring pattern sizes using a scanning electron microscope has been used. Such a system is described in Japanese Patent Publication No. 59-761 published on Jan. 9, 1984. According to this system, two movable position markers are displayed on an image display cathode-ray tube (CRT) by superposing them on a sample scanned image or a secondary electron signal waveform. The size of a sample image or the like is calculated by the distance between the markers. In this case, an operator must select a target pattern to be measured while observing a scanned image, and set an electron beam in a line scanning mode. The two markers superposed on the resultant secondary electron signal waveform are then displayed on the CRT screen. After the operator adjusts the marker positions to a position to be subjected to measurement, the size is calculated according to the marker distance and a magnification. Therefore, the operator must designate the measuring point for each measurement. Because of this, a plurality of points cannot be automatically and continuously measured.

In order to measure a wiring width upon automatic setting of a slice level, a secondary electron signal can be converted to a digital signal, and a wiring portion can be selected according to the digital signal and then measured. In size measurement, however, the numbers of secondary electrons, depending on the kind of material, are measured without application of an external voltage. If line scanning is performed on materials having identical secondary electron emission ratios or if a charge-up phenomenon tends to occur due to radiation conditions, an edge of an underlying material may be erroneously detected as the edge of a wiring portion. For example, when the charge-up phenomenon occurs and a secondary electron signal waveform as shown in FIG. 1(a) is obtained, its digitized signal waveform is as shown in FIG. 1(b). Although an actual wiring width is given as L, it is erroneously detected as l. Thus, a distance (incorrect width) different from a target distance is measured.

SUMMARY OF THE INVENTION

It is, therefore, a principal object of the present invention to provide a charged beam radiation apparatus wherein a potential state of all or part of a sample is changed to more accurately measure its size.

It is another object of the present invention to provide a charged beam radiation apparatus wherein a charge-up phenomenon caused by samples of different materials or different radiation conditions of a measuring electron beam can be prevented, thereby more accurately measuring the sample size.

In order to achieve the above objects of the present invention, there is provided an apparatus for measuring the size and characteristics of a sample by changing a potential state of the sample according to the following two modes. In the first mode, a predetermined portion of the sample is irradiated with an electron beam in a noncontact manner, such that a secondary electron emission ratio $\delta$ is smaller than 1 and an irradiated portion is set in a negative potential state. In the second mode, a voltage is applied to the entire sample in a contact manner to change a surface potential thereof. In the first mode, the apparatus for measuring a sample size utilizes a change in numbers of secondary electrons before and after the potential state is changed. In the second mode, an apparatus for measuring a size utilizes a change in number of secondary electrons according to a change in surface potential.

According to an aspect of the present invention, there is provided a charged beam radiation apparatus including auxiliary charged beam emitting means for emitting an auxiliary charged beam of a given acceleration voltage onto a predetermined portion of an electronic device to be measured; main charged beam emitting means for emitting a main charged beam of an acceleration voltage lower than that of the auxiliary charged beam onto the predetermined portion and the vicinity of the predetermined portion; secondary electron detecting means for detecting secondary electrons generated from a portion irradiated by the main charged beam; and means for measuring a change in a secondary electron signal from the secondary electron detecting means.

According to another aspect of the present invention, there is provided a charged beam radiation apparatus wherein the bias voltage applying means is a power source for directly applying the bias voltage to the electronic device to be measured.

BRIEF DESCRIPTION OF THE DRAWINGS

FIGS. 1(a) and 1(b) are timing charts for explaining the operation of a conventional charged beam radiation apparatus;

FIGS. 9(a) and 9(b) are secondary electron signal waveforms for explaining another operation according to the present invention;

FIG. 11 is a graph showing the relationship between the surface potential and the detected number of secondary electrons so as to explain the principle of the present invention;

FIGS. 12(a) to 12(d) are secondary electron signal waveforms showing measurement results obtained by the apparatus in FIG. 10;

FIGS. 14(a) to 14(c) are secondary electron signal waveforms for explaining the operation of the apparatus in FIG. 10;

FIG. 16(a) and 16(b) are graphs showing changes in a secondary electron signal due to the presence/absence of a substrate voltage when the apparatus in FIG. 10 is used;

FIGS. 18(a) and 18(b) are schematic views showing modifications of the arrangements in FIGS. 10 and 17;

DESCRIPTION OF THE PREFERRED EMBODIMENT

A charged beam radiation apparatus for measuring a sample size and leak characteristics after the potential state of a predetermined portion of a sample is changed in a noncontact manner will be exemplified.

Figure 2:
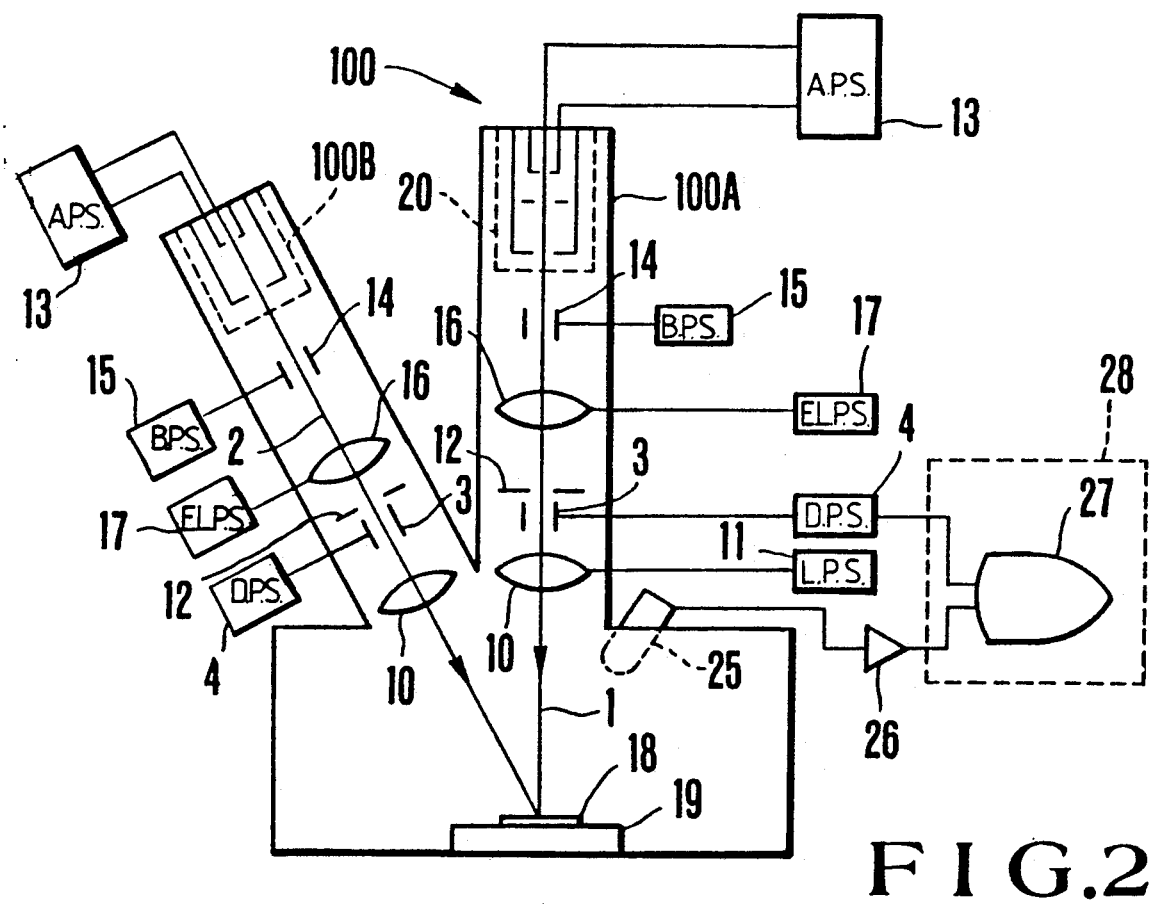
FIG. 2 is a schematic view of a charged beam radiation apparatus according to an embodiment of the present invention.

FIG. 2 shows a charged beam radiation apparatus according to an embodiment of the present invention. Referring to FIG. 2, a charged beam radiation apparatus 100 has columns 100A and 100B for emitting first and second electron beams 1 and 2. Since these columns have an identical structure, a description will be exemplified by the column 100A. The same reference numerals in the column 100B denote the same parts as in the column 100A. The column 100A accommodates a deflection electrode 3 connected to a deflection power source (D.P.S.) 4 to deflect the electron beam 1, an objective lens 10 connected to an objective lens power source (L.P.S.) 11 to focus the electron beam 1, a blanker 14 connected to a blanking power source (B.P.S.) 15 to turn on/off the electron beam 1, an electrostatic lens 16 connected to an electrostatic lens power source (E.L.P.S.) 17, and a blanking aperture 12. A beam source 20 is arranged at the top of the column 100A to generate the electron beam 1. An acceleration power source (A.P.S.) 13 is connected to the beam source 20 to accelerate the electron beam 1. A stage 19 is arranged inside the apparatus 100. A target electronic device 18 such as a wafer to be measured is placed on the stage 19. A secondary electron detector 25 is mounted in the apparatus 100 to detect secondary electrons generated upon emission of the first and second electron beams 1 and 2 onto the electronic device 18. The detected secondary electrons are supplied to a processor 28, including a display 27, through an amplifier 26. A signal from the deflection power source 4 is also supplied to the display 27 in the processor 28, thereby displaying a secondary electron signal waveform obtained by line scanning on the display 27.

Before describing a measuring method using the apparatus in FIG. 2, the relationship between the acceleration voltage and the second electron emission will be briefly touched upon. A secondary electron emission ratio δ is defined as a ratio of the number of generated secondary electrons to the number of input beam electrons. The secondary electron emission ratio δ normally has a peak at an acceleration voltage of several hundreds of volts, and is decreased inversely upon an increase in acceleration voltage in the acceleration voltage range exceeding several hundreds of volts. For example, the ratio δ is 1 at an acceleration voltage of about 2 to 3 kV for a material such as polysilicon and aluminum used as a metal wiring in the LSI fabrication process. When the acceleration voltage exceeds 2 to 3 kV, the ratio δ is less than 1; and when the voltage is less than 2 to 3 kV, the ratio δ is more than 1. If δ>1, the number of secondary electrons is larger than the number of input electrons and the irradiated substance is positively charged. However, if δ<1, the irradiated substance is negatively charged. In addition, if δ=1, no charge-up of the substance occurs.

In order to observe an image of the entire sample, an acceleration voltage is applied to the sample so as not to charge it up (i.e., δ=1), and the sample is observed through a scanning electron microscope. However, no difference occurs between the number of secondary electrons from the wiring layer on the electronic device 18 and the number of secondary electrons from the underlying material according to a given acceleration voltage and the given materials. Thus, the wiring layer cannot be distinguished from the underlying material, with subsequent failure of wiring width measurement. In this case, the second beam as the main feature of the present invention is used.

In order to operate the electron beam radiation apparatus described above, the second beam 2 is deflected and a target portion (e.g., a wiring on the wafer) is irradiated with the deflected second electron beam 2. The acceleration voltage of the second electron beam 2 is set to be a level corresponding to a secondary electron emission ratio δ of less than 1, and the irradiated portion is negatively charged. More secondary electrons tend to be emitted from the surface of the negatively charged portion than those from other portions of the sample. In other words, the number of secondary electrons emitted from the negatively charged portion is larger than that from other portions of the sample when the first beam 1 is radiated on the negatively charged portion. When the first electron beam 1 is thus emitted, a saw-tooth or triangular wave voltage is applied to the deflection electrode 3 in the column 100A to line-scan the electronic device 18 including the irradiated portion. An acceleration voltage for the first electron beam 1 is set to correspond to δ=1 or near it (i.e., a condition where the irradiated portion is neither negatively nor positively charged). The secondary electrons generated at this time are detected by the secondary electron detector 25. Therefore, a change in secondary electron signal by line scanning with the first electron beam 1 is displayed on the display 27 in the processor 28.

Figure 3A:
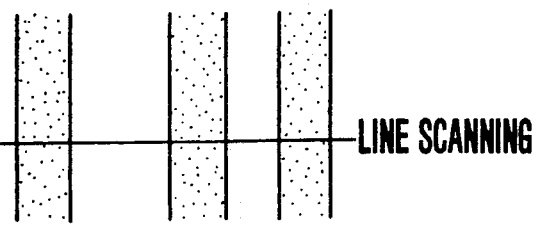
FIGS. 3(a) to 3(e) are views for explaining the principle of measurement using the apparatus shown in FIG. 2.
Figure 3B:
Figure 3C:

FIGS. 3(a) to 3(e) are views for explaining an example of measurement. FIG. 3(a) shows a measurement pattern wherein dotted areas are wiring regions. FIGS. 3(b) and 3(c) show changes in secondary electron signal level upon line scanning with the first electron beam 1. More specifically, FIG. 3(b) shows a case when the target region is irradiated with only the first electron beam 1. In this case, no difference occurs between the number of secondary electrons from the wiring region and the number of secondary electrons from the underlying material. In this state, point A of the pattern in FIG. 3(a) is irradiated with the second electron beam 2. It is assumed that the first electron beam 1 for measuring a sample size is accelerated at a low acceleration voltage corresponding to $\delta = 1$ or near it, and that the second beam 2 is accelerated at a high acceleration voltage corresponding to $\delta < 1$ so as to negatively charge the sample portion. Under these assumptions, the wiring region including the point A is negatively charged. If the point A is irradiated with the first beam 1 after being negatively charged, a larger number of secondary electrons are generated compared to the case wherein the wiring region including the point A is not negatively charged. As a result, as shown in FIG. 3(c), the change in the number of secondary electron signals occurs due to line scanning with the first electron beam 1. Therefore, the wiring region can be easily distinguished from the underlying material. Even if the wiring material and its underlying material have the same secondary electron emission ratio $\delta$, the wiring width can be accurately measured.

Figure 3D:
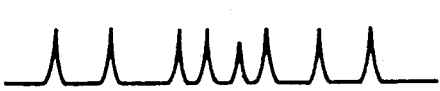
Figure 3E:

In addition, even if a pike noise is generated, accurate size measurement can be achieved. FIGS. 3(d) and 3(e) show changes in secondary electron signal level upon line scanning with the first electron beam 1. Noise or spike pulses caused by defects are mixed in with the secondary electron signals, as indicated by arrows in FIGS. 3(d) and 3(e). FIG. 3(d) shows the case wherein the wiring region is irradiated with only the first electron beam 1. As is apparent, it is difficult to determine the edge of the wiring region and thus to perform measurement due to spike noise. On the other hand, FIG. 3(e) shows the case wherein the wiring region is irradiated with the second electron beam 2 before measurement by the first beam 1. Since the wiring region is negatively charged upon radiation with the second electron beam 2, the number of secondary electrons is increased in only the wiring region. Therefore, the wiring layer can be easily measured even if spike noise is mixed in with the secondary electron signal.

In the above measuring method, secondary electrons are also generated upon radiation with the second electron beam 2. If a single portion is irradiated with the second electron beam, the number of secondary electrons is kept unchanged. Therefore, when the number of secondary electrons generated upon radiation with the second electron beam 2 is detected by the secondary electron detector 25, a signal from the secondary electron detector 25 represents a reference number of secondary electrons as a background level. In order to obtain only the secondary electron signal generated upon radiation with the first ,electron beam 1 (i.e., line scanning), the background level determined for the second electron beam 2 without radiation of the first electron beam 1 is calculated in advance, and is subtracted to obtain the secondary electron signal generated upon radiation of the first electron beam 1. Alternatively, pulses of the first and second electron beams 1 and 2 are alternately radiated on the wiring region and the secondary electrons are detected at ON timings of the pulses of the first electron beam 1.

A conventional method of measuring a pattern size can be applied using the waveform in FIG. 3(c). More specifically, a wiring edge, for example, is detected according to a change in secondary electron signal upon line scanning with the first electron beam 1, and a wiring size is calculated according to the detected pulse width and a magnification. The pulse width can be calculated by the following techniques. A slice level is set and the secondary electron signal is digitized. Alternatively, two slice levels are set and the secondary electron signal is converted to a three-value signal. A signal representing attachment of a foreign material on the wiring layer or noise is distinguished from an edge signal and the edge signal is corrected to measure its pulse width in accordance with the order of the three-value pulses, as described in a prior art application filed by the present applicant.

Size measurement can be performed as follows. A sample is irradiated with and charged by the second electron beam 2. Beam radiation is then stopped and line scanning with the first electron beam 1 is performed to measure the sample size In either case described above, a predetermined portion of the sample is charged with the second electron beam 2 in a noncontact manner, and line scanning with the first electron beam 1 is performed for the predetermined portion. The number of secondary electrons emitted from the predetermined portion of the sample is larger than that of other portions thereof. Therefore, accurate size measurement can be achieved.

The following electronic device test can be performed using the apparatus in FIG. 2, in addition to the accurate size measurement described with reference to FIG. 3.

Figure 4:
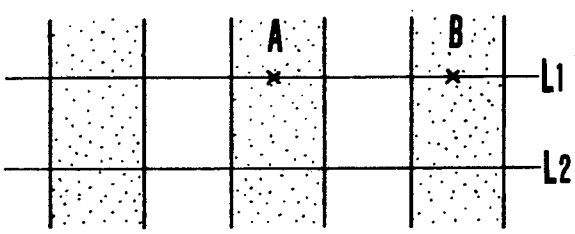
FIGS. 4 to 5(b) are views for explaining a short-circuit and leak test of electronic devices by using the apparatus in FIG. 2.
Figure 5A:
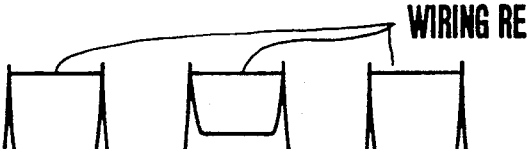
Figure 5B:
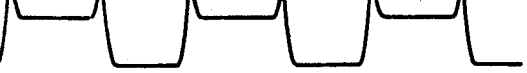
Figure 6:
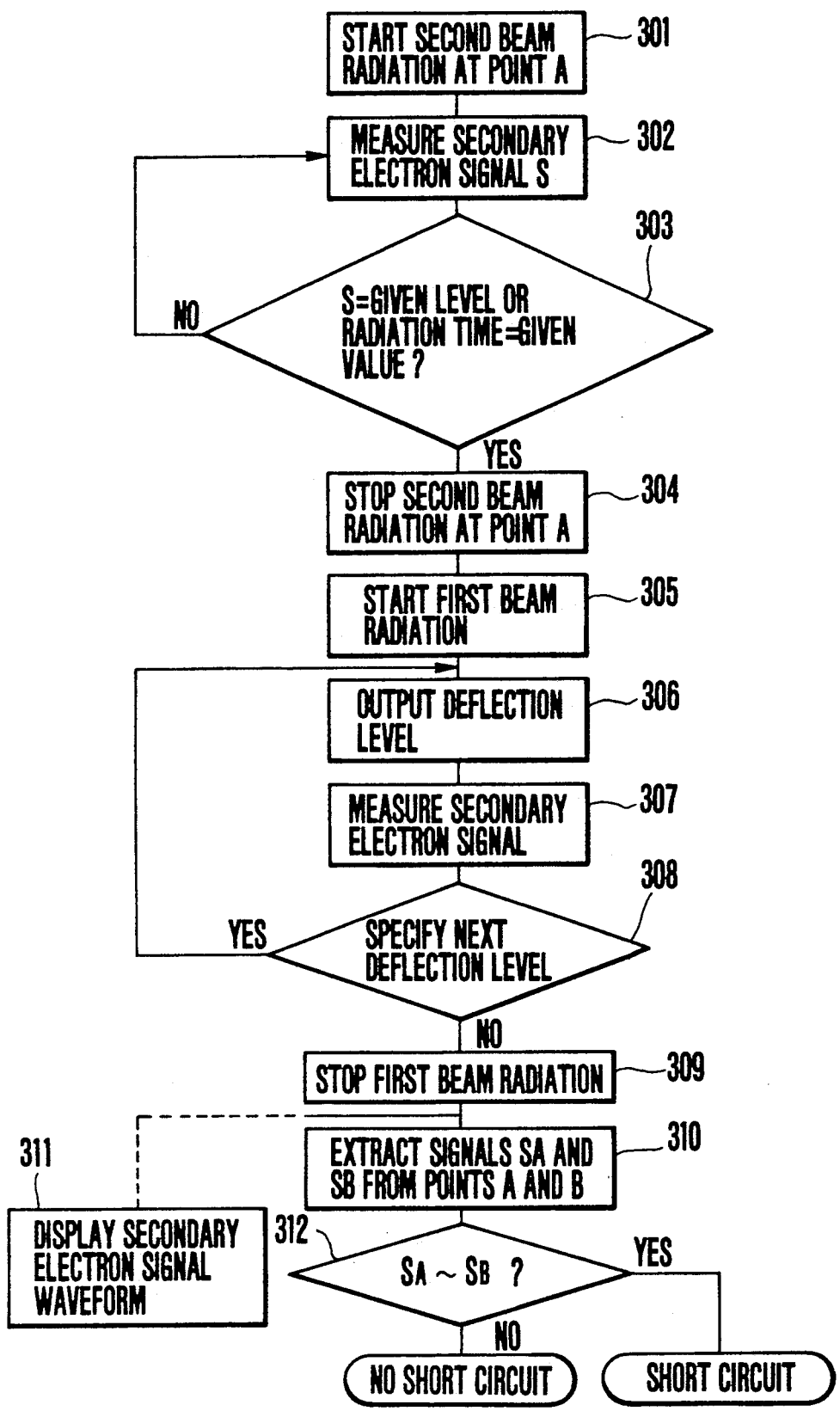
FIG. 6 is a flow chart for explaining the operation used in association with FIGS. 4, 5(a), and 5(b)

FIGS. 4, 5, and 6 explain procedures for a short-circuit and leakage test of an electronic device, using the apparatus in FIG. 2. Dotted regions in FIG. 4 represent the wiring layers on an insulating film.

Referring to FIG. 6, a point A (FIG. 4) of a wiring on an electronic device 18 on the stage 19 is irradiated with the second electron beam 2 in step 301. In this case, the second electron beam 2 is accelerated at a high voltage (i.e., $\delta < 1$) to cause the negative charge-up. In step 302, a secondary electron signal S derived through the secondary electron detector 25 and the amplifier 26 is measured. Whether the secondary electron signal S reaches a given level or whether a potential at the point A reaches a given value is determined in step 303. If YES in step 303, the flow advances to step 304, and the wiring region including the point A is no longer irradiated with the second electron beam 2.

In step 305, the wiring region is irradiated with the first electron beam 1. In step 306, the deflection power source 4 is controlled to start scanning along a line $L_1$ in FIG. 4. In this case, the first electron beam 1 is accelerated at a voltage ($\delta = 1$) so as not to cause charging of the irradiated portion. Upon line scanning with the first electron beam 1, the secondary electron signal is supplied to the processor 28 through the secondary electron detector 25 and the amplifier 26. In step 307, the secondary electron signal is then measured. In step 308, the next deflection magnitude is specified. The flow returns to step 306 and the above operation is repeated. When predetermined scanning has been completed, the flow advances to step 309. In this step, the wiring region is no longer irradiated with the first electron beam 1. The waveforms in FIGS. 5(a) and 5(b) are displayed on the display 27 in the processor 28, in accordance with the resultant secondary electron signal obtained by the above steps and the deflection signal supplied to the deflection electrode 3.

In step 310, secondary electron signals SA and SB at points A and B in the wiring regions in FIG. 4 are extracted in accordance with the secondary electron signal described above. In step 312, the signals SA and SB are compared with each other. If NO in step 312, no short-circuit has been formed between the points A and B. However, if YES in step 312, a short-circuit has been formed between the points A and B. In the above description, first beam radiation is started after the second beam radiation is stopped. However, the first beam radiation can be performed simultaneously with the second beam radiation. The waveforms in FIGS. 5(a) and 5(b) will be described in more detail below.

The wiring layer including the point A is negatively charged with the second electron beam 2. If no short-circuit is formed between the wiring layers and no leakage occurs, a potential at the point A is lower than that at the point B to increase the level of the secondary electron signal. However, if a short-circuit is formed between the wiring layers, the potential at the point A is substantially the same as that at the point B, as is the number of secondary electrons. If no short-circuit is formed between the wiring layers and no leakage occurs, the changes in levels of the secondary electron signals from the wiring layers including the points A and B upon line scanning with the first electron beam 1 are detected, as shown in FIG. 5(a). Otherwise, the uniform changes in levels of the secondary electron signals are detected, as shown in FIG. 5(b). If slight leakage occurs, the potentials at the points A and B are not equal, but a difference therebetween is smaller than that in the case wherein a short-circuit is formed or a significant leakage occurs. In order to calculate the difference between the value in the case of slight leakage and the value in the case free from short-circuits or leakage, the difference between a value obtained with the second beam 2 radiation and a value obtained without it is calculated to obtain a signal having an emphasized short-circuit or leakage. It should be noted that the scanning position of the first beam 1 need not pass through the point A and may be deviated from the point A, as indicated by line $L_2$ in FIG. 4.

The charged beam radiation apparatus according to the present invention includes means for emitting a charged beam onto a predetermined portion of an electronic device to cause the secondary electron emission ratio δ of less than 1, means for scanning and emitting another charged beam at an acceleration voltage to cause the secondary electron emission ratio δ of 1 or about 1, means for detecting secondary electrons from the irradiated portion, and means for detecting a change in a secondary electron signal upon scanning of the charged beam. Thus, accurate pattern size measurement of a wiring portion and a space portion having a small contrast difference therebetween, and interwiring leakage and short-circuit detection by a noncontacting means can be achieved.

In the above embodiment, the sample is exemplified by a structure of a metal wiring layer on an underlying layer. The sample may also be represented by a pattern, such as a resist pattern on an insulating film or a resist pattern on a metal film. The sample may also be a semi-finished product.

In the above embodiment, the first and second beams are electron beams. The second beam can be any negatively charged beam for negatively charging a predetermined portion, e.g., a wiring layer. The first beam is used for detection so that it can be any charged beam having a small beam current so as not to easily cause charge-up upon beam radiation. The charge-up beam radiation need not be limited to spot radiation, but can be extended to line scanning or two-dimensional scanning.

Figure 7:
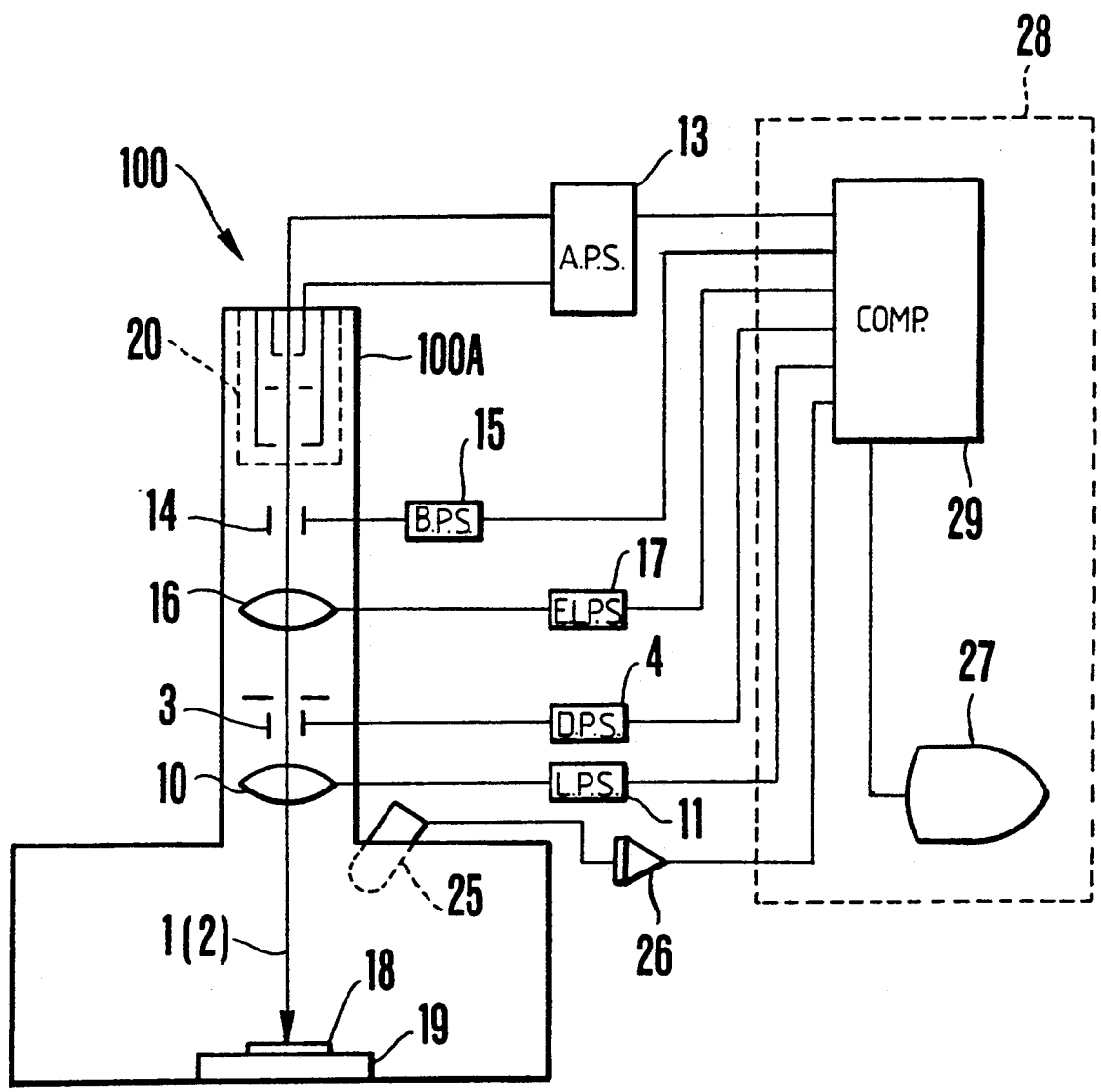
FIG. 7 is a schematic view of a charged beam radiation apparatus with a single column according to another embodiment of the present invention.
Figure 8:
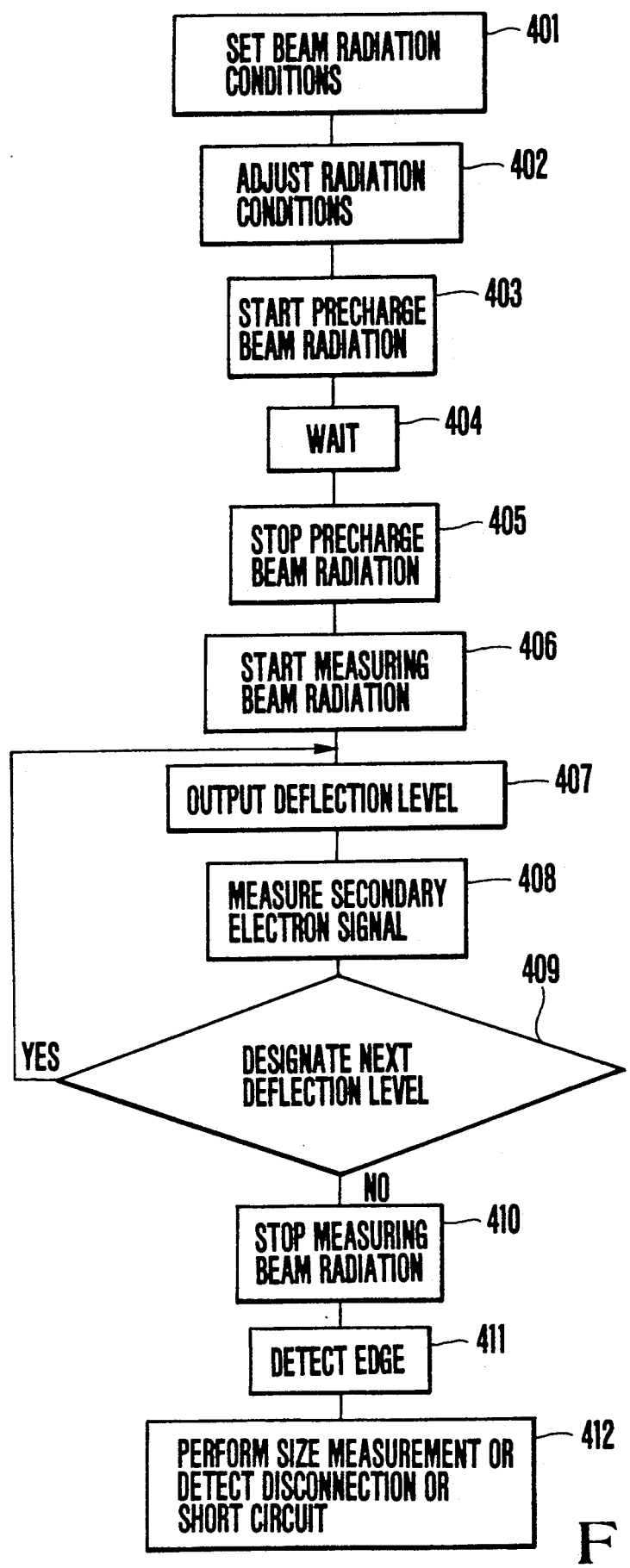
FIG. 8 is a flow chart for explaining the operation in FIG. 7.

FIG. 7 shows a charged beam radiation apparatus according to another embodiment of the present invention. In this apparatus, first and second beams are generated by a single column. The same reference numerals in FIG. 7 denote the same parts as in FIG. 1. Referring to FIG. 7, an acceleration power source 13, a blanking power source 15, an electrostatic lens power source 17, a deflection power source 4, and an objective lens power source 11 are connected to a computer (comp.) 29, serving as a controller in a processor 28, to control the focus of the beam and adjustment of the radiation position The operation of the apparatus in FIG. 7 will be described with reference to the flow chart in FIG. 8. In the following description, the operation for radiating a beam of a high acceleration voltage to negatively charge the wiring prior to radiation with a deflected beam 1 is called "precharge."

In step 401, beam radiation conditions for precharge are set under the control of the computer 29. In step 402, a beam deflection level is adjusted to cause a precharge beam 2 to be incident on a target precharge position of an electronic device 18 such as a wafer placed on a stage 19, thereby adjusting the beam position. In step 403, the predetermined position of the electronic device 18 is irradiated with the precharge beam 2 at a first acceleration voltage under the control of the computer 29. In this case, the first acceleration voltage of the precharge beam 2 is set at a high acceleration voltage to obtain a secondary electron emission ratio δ of less than 1. The wiring portion to be measured is thus negatively charged. This precharging allows more emission of secondary electrons from the irradiated wiring portion of the electronic device 18 than that from other portions thereof. In other words, the number of secondary electrons from the irradiated wiring portion is increased.

Radiation with the precharge beam 2 is continuous for a predetermined period of time (step 404). In step 405, the computer 29 performs precharge off processing.

The computer 29 in the processor 28 changes the acceleration voltage to the second acceleration voltage which does not easily cause charge-up of the irradiated portion, thereby generating the beam 1 (step 406). Thereafter, the flow advances to step 407. The computer 29 controls the deflection power source 4 to adjust a deflection level of the beam 1. A predetermined position of the electronic device 18, which is determined by the set deflection level, is then irradiated with the beam 1. The secondary electrons generated from the irradiated position are detected by a secondary electron detector 25 and are stored in a memory (not shown) in the computer 29 through an amplifier 26. In step 409, a deflection level corresponding to the position to be irradiated with the next beam is designated by the computer 29. The flow then returns to step 407. Repeated operations of steps 406, 407, 408, and 409 represent line scanning of the electron beam 1 on the electronic device 18, in a direction crossing the precharged wiring layer since the deflection power source 4 applies a saw-tooth or triangular wave voltage to the deflection electrode 3. When line scanning is completed, the flow advances to step 410 wherein electron beam off processing is executed. In step 411, a wiring edge is detected according to a change in level of the secondary electron signal stored in the memory in the computer 29. In step 412, the wiring size measurement or the disconnection and short-circuit detection is performed according to a conventional technique. The above measurement and detection can be performed as in FIGS. 3(a) to 5(b). The change in level of the secondary electron signal stored in the memory in the computer 29 can be displayed on a display 27 as needed.

When the precharge acceleration voltage is switched to the measuring acceleration voltage, the beam deflection level and the objective lens must be adjusted. Outputs from the acceleration power source 13, the deflection power source 4, the objective lens power source 11, the blanking power source 15, and the electrostatic lens power source 17 are controlled by the computer 29. More specifically, the beam on/off timing is controlled by the blanking power source 15, and the beam current is controlled by the electrostatic lens power source 17. A beam current is increased for precharging and is decreased for measurement. SEM images used for precharging and measurement are displayed on the display 27 prior to measurement, thereby calculating an optimal deflection level and an optimal value for the lens power source. The calculated values are then stored in the computer 29. The deflection power source 4 and the objective lens power source 11 can be controlled in synchronism with the acceleration power source 13, in accordance with the storage data.

A conventional method of measuring a pattern size can be applied using the waveform in FIG. 3(c). More specifically, a wiring edge, for example, is detected according to a change in secondary electron signal upon line scanning with the first electron beam 1, and a wiring size is calculated according to the detected pulse width and a magnification. The pulse width can be calculated by the following techniques. A slice level is set and the secondary electron signal is digitized. Alternatively, two slice levels are set and the secondary electron signal is converted to a three-value signal. A signal representing attachment of a foreign material on the wiring layer or noise is distinguished from an edge signal and the edge signal is corrected to measure its pulse width in accordance with the order of the three-value pulses.

The present invention is not limited to the embodiment described above. Various changes and modifications may be made within the spirit and scope of the invention. In the above embodiment, the precharge beam has an acceleration voltage corresponding to $\delta < 1$, and the measuring beam has an acceleration voltage corresponding to $\delta = 1$ or about 1. However, an acceleration voltage corresponding to a ratio $\delta$ slightly smaller than 1 may be used to increase a beam current, thereby performing precharging. The beam current may then be decreased not to charge the irradiated portion, thereby allowing measurement. The same effect as in the above embodiment can be achieved in this modification, as will be exemplified in still another embodiment of the present invention, shown in FIGS. 9(a) and 9(b). FIGS. 9(a) and 9(b) show the measurement result wherein an acceleration voltage of 3 kV is applied to poly-Si wiring regions on a 150-Å thick $SiO_2$ film to increase a beam current, thereby precharging the poly-Si wiring regions and, thereafter, the beam current is decreased to measure a secondary electron signal waveform. FIG. 9(a) shows the secondary electron signal waveform without precharging and FIG. 9(b) shows it with precharging. In comparing the case with precharging in FIG. 9(b) to that without precharging in FIG. 9(a), the number of secondary electrons emitted from the central poly-Si wiring layer is increased to improve contrast, and the wiring layer can be easily distinguished from the underlying $SiO_2$ film. Changes in contrast occur in all precharged poly-Si wiring layers. The charges of the poly-Si wiring layers are kept for a predetermined period of time. The stage can be moved to allow measurement of the wiring layer after it is precharged.

The second mode of operation of the apparatus for applying a voltage to the entire sample to change the surface potential of the sample and subsequent measuring of the sample size will be described below.

Figure 10:
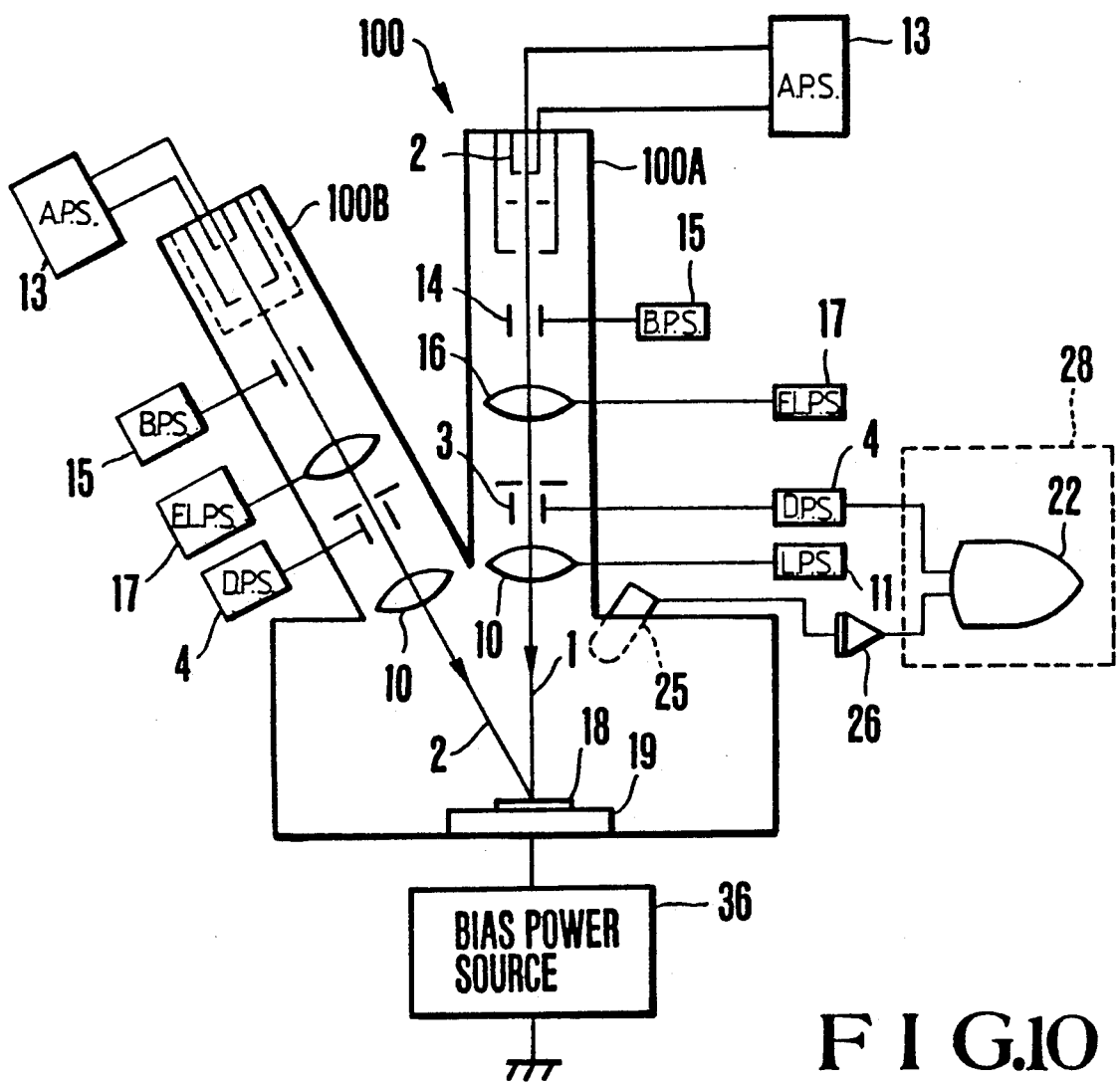
FIGS. 10 is a schematic view showing a charged beam radiation apparatus according to still another embodiment of the present invention.

FIG. 10 shows a charged beam radiation apparatus according to still another embodiment of the present invention, exemplified in particular as a modification of FIG. 2. According to the embodiment in FIG. 10, a voltage is applied to a stage or a device substrate to more effectively prevent the charge-up phenomenon.

The same reference numerals in FIG. 10 denote the same parts as in FIG. 2, and a detailed description thereof will be omitted. A characteristic portion in FIG. 10 is a bias power source 36 inserted between a stage 19 and ground to positively bias the stage 19. The bias power source 36 may be directly connected to an electronic device 18.

The principle of the above embodiment will be described below. The secondary electron emission ratio $\delta$ is generally a function of the surface potential. If the surface potential is high, the probability of secondary electrons being emitted from the surface is decreased and the emission ratio $\delta$ is decreased accordingly. In other words, if a substrate voltage is high, $\delta$ is decreased. The secondary electrons emitted upon electron beam radiation or reflected electrons are captured by a secondary electron detector 25 or by other regions on the electronic device (e.g., a wafer) 18, in accordance with an ambient electric field. FIG. 11 shows the dependency of the secondary electron signal on the surface potential. The secondary electrons generated at a high surface potential or secondary electrons generated by reflected electrons bombarding against the column do not reach the secondary electron detector 25, but return to the wafer 18. Therefore, the level of a secondary electron signal S is reduced. In this case, a larger number of electrons are captured by a region of the wafer 18 having a higher surface potential. If a larger number of electrons are captured by this region of higher potential, the potential of that region is decreased. Therefore, the surface potential profile of the wafer 18 becomes uniform. In addition, the higher the surface potential is, the larger the number of electrons captured by the wafer. The surface potential of the wafer thus becomes effectively uniform. Assuming the above, if the surface potential of the entire wafer is increased, the surface potential becomes uniform (preventing the charge-up phenomenon and degradation of the contrast effect). If the surface potential is high, some of the secondary electrons in the secondary electron signal S are captured by the wafer and the final level of the secondary electron signal S is decreased accordingly. The ratio of reflected electrons to the secondary electrons is relatively increased and, thus, an image that is least influenced by the effects of an increased surface potential, such as the charge-up phenomenon, can be obtained. The surface potential of a metal wafer not having an insulating film formed thereon can be changed upon application of a substrate voltage to the stage for loading a wafer thereon. In addition, in a wafer covered with an insulating film, the surface potential of the wafer can be changed upon application of the substrate voltage. When a surface potential is changed upon beam radiation, an electric field is generated in the insulating film. In this state, if a substrate voltage is changed, the surface potential is changed by capacitive coupling through the electric field in the insulating film. Therefore, the charge-up phenomenon can be prevented by the change in substrate voltage for a wafer covered with an insulating film formed thereon. However, it is obvious that the above effect is better for a wafer not having an insulating film formed thereon.

FIGS. 12(a) to 12(d) show the results of measurement based on the above embodiment. The characteristics in FIGS. 12(a) to 12(d) are obtained by changing only the bias voltage without precharging the wafer, illustrating the changes in the secondary electron signal level upon line scanning with an electron beam 1 or 2. FIGS. 12(a) and 12(b) show the measurement results when the same region of a stripe-like Al wiring pattern on a 500-Å thick $SiO_2$ film is measured by a crossing beam with the same beam current at a magnification of 17,400 times and at an acceleration voltage of 2 kV. FIGS. 12(c) and 12(d) show the measurement results when the same region of a stripe-like resist pattern on a 300-Å thick $SiO_2$ film is measured with the same beam current at a magnification of 500 times and at an acceleration voltage of 1 kV. The results in FIGS. 12(a) and 12(c) are obtained when a substrate voltage is not applied to the stage 19. Since the substrate is charged, levels of signals from the Al and resist stripe-like regions and the underlying $SiO_2$ portions vary. In this case, the changes are moderate, although the signal magnitudes from the Al and resist regions vary for different stripes. The results in FIGS. 12(b) and 12(d) are obtained when the substrate voltage is applied to the stage 19 (8 V in both FIGS. 12(b) and 12(d)). In this case, the levels of the signals from the stripe regions and the underlying layer are respectively given as substantially identical values. The variations in signal levels for different stripes are not found to provide a substantially trapezoidal waveform. In the case of the results in FIG. 12(c), the levels of the signals from the $SiO_2$ and resist layers are substantially the same. However, the material differences can be distinguished by the substrate voltage, as shown in FIG. 12(d).

In the above embodiment, an external voltage is applied to the substrate to perform measurement. However, as shown in FIG. 3, a specific portion may also be irradiated with the second electron beam 2 in addition to the external voltage application.

Figure 13A:
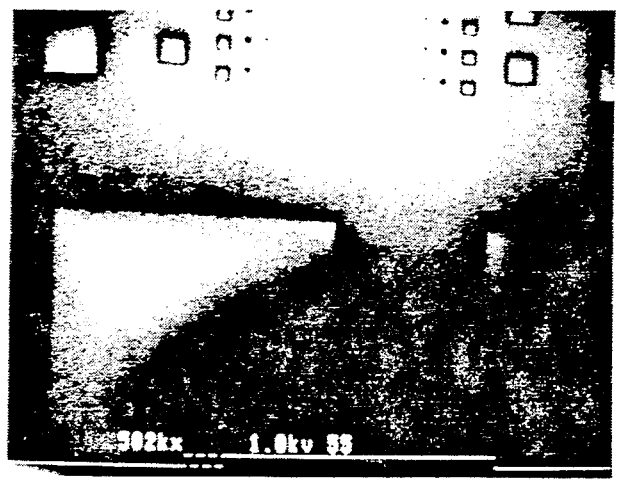
FIGS. 13(a) and 13(b) are photographs of a scanning electron microscope, showing the effect of the apparatus in FIG. 10.
Figure 13B:
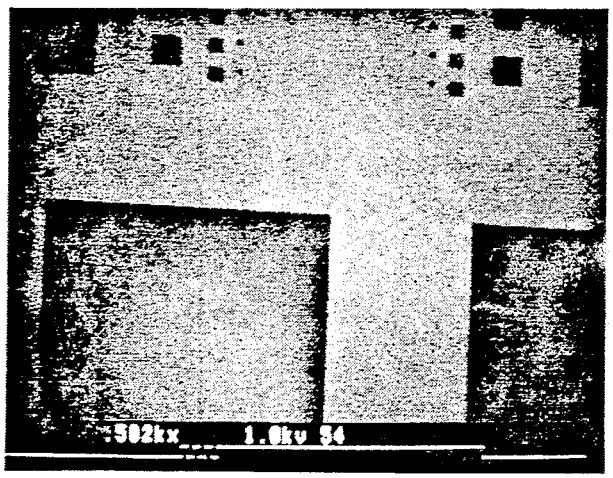

FIGS. 13(a) and 13(b) are photographs taken by a scanning electron microscope so as to explain the effect of the embodiment in FIG. 10. Each photograph shown a 0.5-μm thick resist pattern formed on a 300-Å thick $SiO_2$ film, an acceleration voltage is 1 kV and a magnification is about 500 times. FIG. 13(a) shows a case when the substrate voltage is 0 V and FIG. 13(b) shows a case when the substrate voltage is 10 V. In the photograph of FIG. 13(a), the lower right portion is dark and the resist and $SiO_2$ portions do not have uniform brightness. On the other hand, in the photograph of FIG. 13(b), the resist and $SiO_2$ portions have substantially the same brightness and the resist pattern edges can be clearly observed.

In general, if the substrate voltage is increased, the surface potential profile of the device becomes uniform and the secondary electron signal becomes small. A difference between the maximum and minimum peaks is decreased. However, if the substrate voltage is excessively increased, the secondary electron signal rises moderately. For this reason, the substrate voltage should not be excessively high. The level of the substrate voltage can be explained with reference to an embodiment in FIGS. 14(a) to 14(c). FIGS. 14(a) to 14(c) show the results when a 1-μm thick, 20-μm wide resist pattern formed on a 300-Å thick $SiO_2$ film is measured with a magnification of 2,500 times at an acceleration voltage of 1 kV. FIGS. 14(a), 14(b), and 14(c) show changes in secondary signal levels upon line scanning when the substrate voltages are respectively set at 0 V, 4 V, and 10 V. When the substrate voltage is set at 0 V, the charge-up phenomenon occurs and the levels of the secondary electron signals from the resist and the $SiO_2$ portion are not uniform. However, when the substrate voltage is set at 4 V or 10 V, the numbers of secondary electrons from the resist portion and the $SiO_2$ portion are substantially uniform and the charge-up phenomenon does not occur. In particular, when the substrate voltage is set at 4 V, a substantially trapezoidal waveform is obtained. However, when the substrate voltage is set at 10 V, the secondary electron signal rises moderately, and a trapezoidal waveform cannot be obtained. Therefore, in the above resist pattern, if the substrate voltage is set at 4 V, the charge-up phenomenon can be eliminated and the resultant secondary electron signal waveform can have a substantially trapezoidal waveform. It is apparent that the signal waveform is further distorted if the substrate voltage exceeds 10 V. This waveform distortion occurs particularly in resist pattern measurement. In other cases, the application of a substrate voltage exceeding a given value decreases the contrast.

Figure 15A:
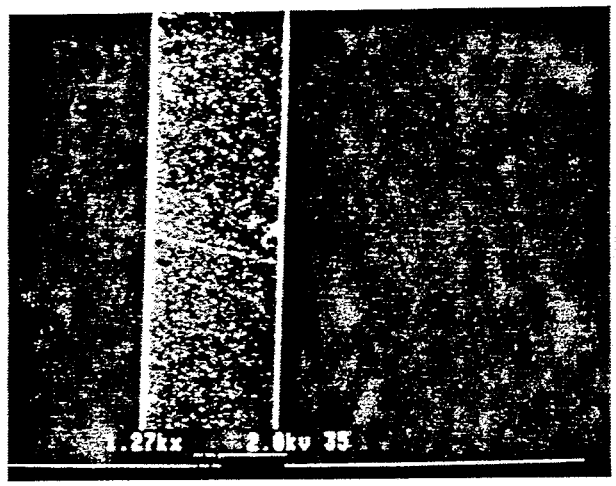
FIG. 15(a) and 15(b) are photographs of the scanning electron microscope, showing the effect of the apparatus in FIG. 10.
Figure 15B:
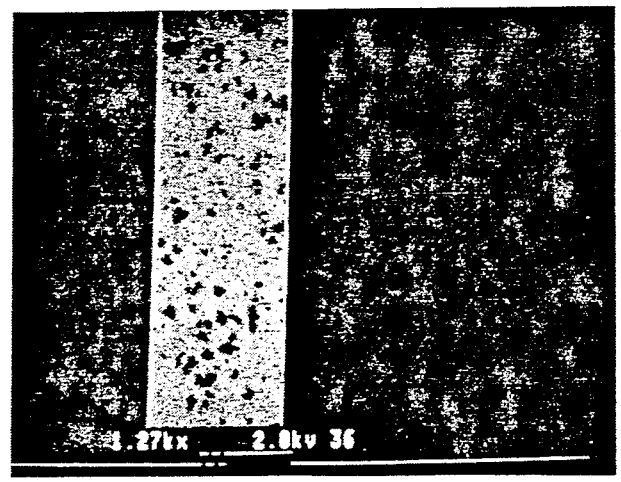

Substrate voltage application can be utilized such that if the contrast between the brightness of a portion to be measured and that of its background portion is too high, a substrate voltage is applied to decrease a difference between the maximum and minimum values of the contrast, thereby optimizing the contrast and achieving easy observation with an SEM (scanning electron microscope). FIGS. 15(a) and 15(b) show photographs taken by the scanning electron microscope and representing the above cases. Each photograph shows a scribing line portion of a poly-Si layer on a 300-Å thick $SiO_2$ film, obtained by dry etching after a 150-Å thick $SiO_2$ film is formed. An acceleration voltage is 2 kV and a magnification is 1,270 times. More specifically, FIG. 15(a) shows a case when the substrate voltage is 0 V and FIG. 15(b) shows a case when the substrate voltage is 7 V. The contrast is too high in FIG. 15(a), and only the poly-Si layer can be observed. However, in FIG. 15(b), the etched residue on the $SiO_2$ layer or the residual $SiO_2$ can be observed. Therefore, information on both the $SiO_2$ region and the poly-Si layer can be obtained. In order to decrease the difference between the maximum and minimum levels of the secondary electron signal, the beam current is normally decreased. When the beam current is to be decreased, no problem is posed in a state free from the charge-up phenomenon. However, the charge-up phenomenon cannot be prevented by decreasing the beam current. This mechanism is explained with reference to FIGS. 16(a) and 16(b), which show changes in secondary electron signals upon line scanning when the beam current varies. A stripe-like Al electrode pattern formed on a 500-Å thick $SiO_2$ film is measured at an acceleration voltage of 2 kV and a magnification of 250 times. The higher the beam current is, the larger the number of detected secondary electrons. FIG. 16(a) shows a case subjected to charge-up at a substrate voltage of 0 V. When the beam current is decreased, the contrast is decreased. However, even if the beam current is decreased, the levels of the secondary electron signals from the Al wiring regions and those from the $SiO_2$ regions are not uniform. For this reason, some Al wiring regions cannot be clearly distinguished from some $SiO_2$ regions. However, when the substrate voltage, is set at 9 V, as in FIG. 16(b), the levels of the secondary electron signals from the Al wiring regions and those from the $SiO_2$ regions are respectively uniform, and the contrast is decreased. In addition, even if the beam current is increased, the charge-up phenomenon does not occur. The resultant secondary electron signal thus has a trapezoidal waveform to allow easy discrimination of the Al wiring regions from the $SiO_2$ regions.

A method of controlling the substrate voltage will be described below. When a test is made while an operator observes the sample through a scanning electron microscope, he checks if a charge-up phenomenon has occurred. If it has occurred, a positive substrate voltage is applied to the stage. In this case, the entire display screen is darkened, and the operator must adjust it to an appropriate brightness. This adjustment is performed by adding a given voltage to the output voltage of the secondary electron detection signal. This operation is also required when the substrate voltage is not applied to the stage. The charge-up phenomenon can also be prevented in the following manner. Changes in secondary electron signal upon line scanning are observed on the CRT display to make the levels of secondary electron signals from the wiring pattern and the underlying film constant. Furthermore, contrast adjustment can also be performed as follows. When a difference between the maximum and minimum levels of the secondary electron signal falls within a given range, optimal contrast can be obtained when the operator observes the sample through the scanning electron microscope.

The charged beam radiation apparatus according to the present invention can be automatically operated such that the sample is irradiated with a beam so as not to cause the charge-up phenomenon and a negative voltage is added to the substrate voltage to emphasize contrast.

Figure 17:
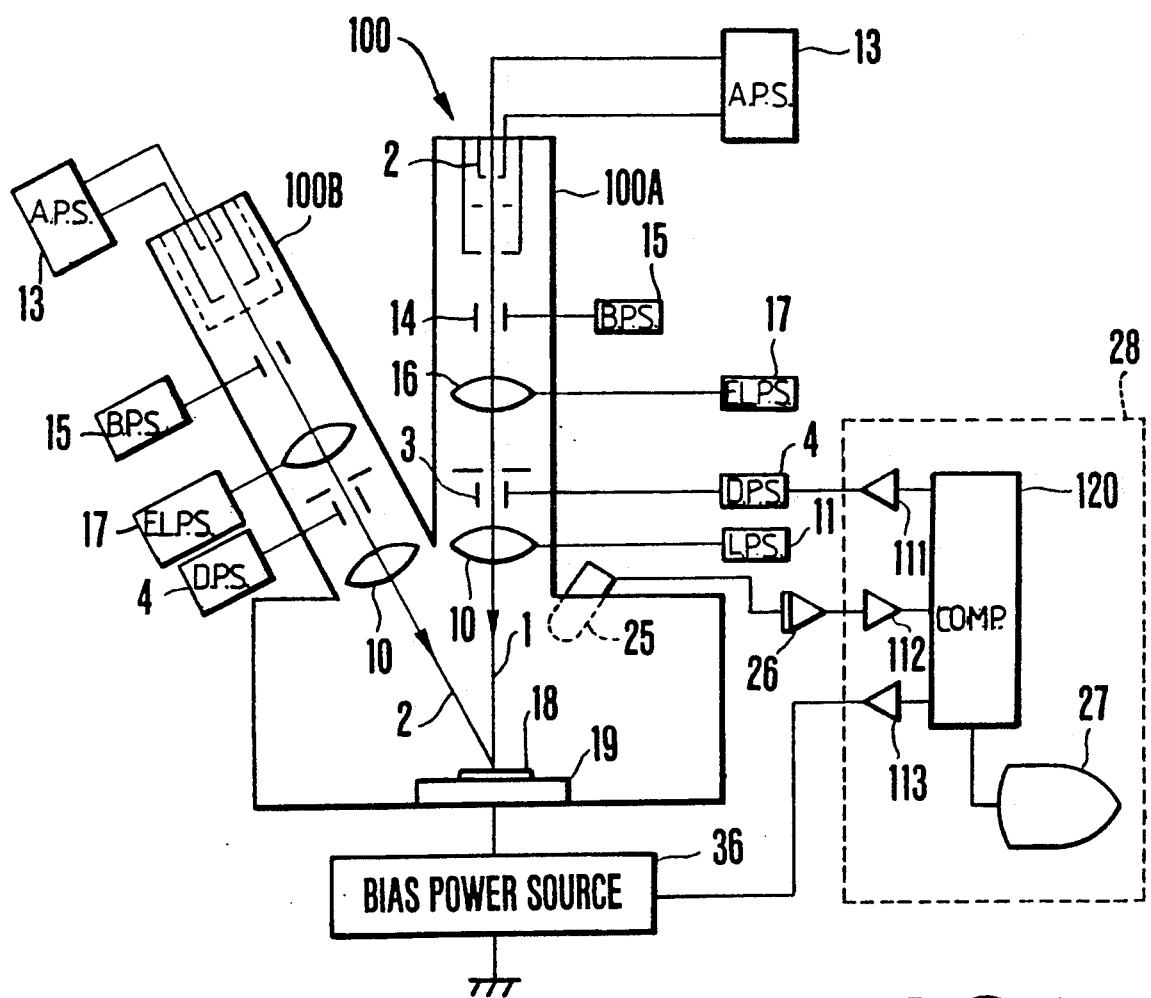
FIG. 17 is a schematic diagram showing a modification of the embodiment in FIG. 10.

FIG. 17 shows a modification of FIG. 10. The arrangement in FIG. 17 differs from that in FIG. 10 in that a deflection power source 4 for controlling a deflection electrode 3 is connected to a computer (comp.) 120 through a D/A converter 111, an amplifier 26 connected to the output of a secondary electron detector 25 is connected to the computer 120 through an amplifier 112, and the computer 120 is connected to a bias power source 36 through a D/A converter 113.

With the above arrangement, the computer 120 reads changes in secondary electron signal in response to a scanning signal. A level of the bias power source 36 is optimized by the D/A converter 113.

Figure 19:
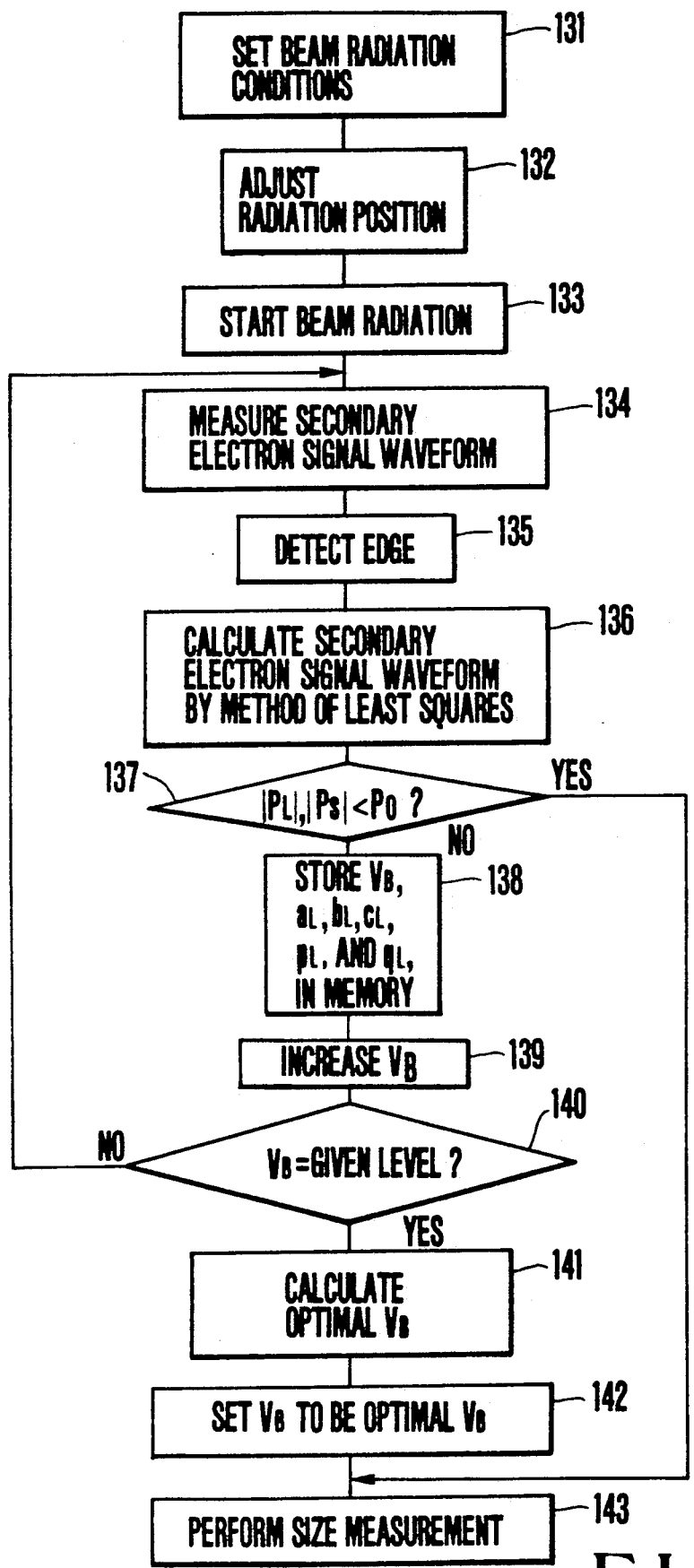
FIG. 19 is a flow chart for explaining the control sequence of the bias voltage.

FIG. 19 is a flow chart showing control procedures of the bias voltage. In step 131, radiation conditions such as an acceleration voltage, a magnification, and a beam current are set. In step 132, the radiation position is adjusted by moving a stage and controlling a deflection level. In step 133, the sample is irradiated with a beam. In step 134, a secondary electron signal waveform (changes in secondary electron signal in response to the scanning signal) is measured. In step 135, a sample edge is detected in accordance with an abrupt change in the waveform of the secondary electron signal. The secondary electron signal waveforms for stripe-like regions and space portions of the sample are approximated by the method of the least squares to a line or a quadratic curve. This approximated value is calculated such that $S_L = a_L X_L^2 + b_L X_L + c_L$ if the level of the secondary electron signal is $S_L$ at a deflection level of $X_L$. If an absolute value of $a_L$ is larger than a reference value $a_O$, the quadratic curve can be approximated as a line so that $S_L = p_L X_L + q_L$. When the charge-up phenomenon occurs at this time, the secondary electron signal level varies with respect to different portions of the samples, and the quadratic curve cannot be approximated as a line or the approximated line is inclined. For this reason, in step 137, absolute values of gradients $p_S$ and $p_L$ of the space and stripe portions are compared with reference value $p_0$. If these gradients are smaller than the reference value, no charge-up occurs. The flow then advances to step 143 and the sample length is measured. However, if these gradients are larger than the reference value, a current bias voltage $V_B$ and the coefficients $a_L$, $b_L$, $c_L$, $p_L$, and $q_L$ of the approximated curve and line are stored in a memory. Thereafter, in step 138, the bias voltage $V_B$ is increased. Whether the bias voltage is increased to a given level is checked in step 140. If NO in step 140, the flow returns to step 134. The above measurement is repeated. However, if YES in step 140, a bias voltage minimizing the absolute value of $p_L$ or $a_L$ is calculated in step 141. In step 142, the optimal bias voltage is output from the D/A converter. Length measurement is performed in step 143.

With the above processing, since a secondary electron signal waveform free from charge-up variations can be obtained, pattern detection can be accurately performed during length measurement, thus improving the length measurement precision. In addition, charge-up control can be simplified since the radiation conditions are kept unchanged and hence lens adjustment need not be performed.

In order to prevent the charge-up phenomenon by changing the number of secondary electrons captured by the wafer upon changing of an electric field around the wafer in the above embodiment, a bias voltage is applied to the stage or the substrate. However, the stage or substrate may be grounded while an electrode is arranged above the wafer and is applied with a bias voltage of an opposite polarity, thus relatively changing the bias voltage of the electronic device, as shown in FIGS. 18(a) and 18(b). FIG. 18(a) shows an arrangement wherein an electrode 122 is mounted on the lower end of an electrooptical column 100A through an insulating film 121 and a bias voltage is applied from a bias power source 123 to the electrode 122. FIG. 18(b) shows an arrangement wherein the electrode 122 is arranged to cover the wafer 18 placed on the stage 19 and part of the electrode 122, i.e., a portion corresponding to the secondary electron detector 25, is a meshed portion. However, the stage 19 or the substrate 18 may be grounded and the potential of the column may be increased by $-10$ to $+10$ V to obtain the same effect as described above.

With either arrangement described above, if a difference between the secondary electron signal from the stripe-like portion and that from the space portion is small since the positive charge-up occurs upon electron beam radiation, a specific portion is irradiated with the second beam and is negatively charged to emphasize the contrast between the stripe and space portions, thereby achieving accurate length measurement. In addition, if the levels of the secondary electron signal at different portions of a single sample are different due to the negative charge-up upon electron beam radiation, a bias is applied to the electronic device to make the local potential differences thereof to be uniform, and thereafter, accurate length measurement can be performed.

The optical axis adjustment, focus adjustment, and deflection correction, which are accompanied by a change in acceleration voltage, need not be performed, in contrast to the conventional adjustment method for preventing charge-up.

Figure 20:
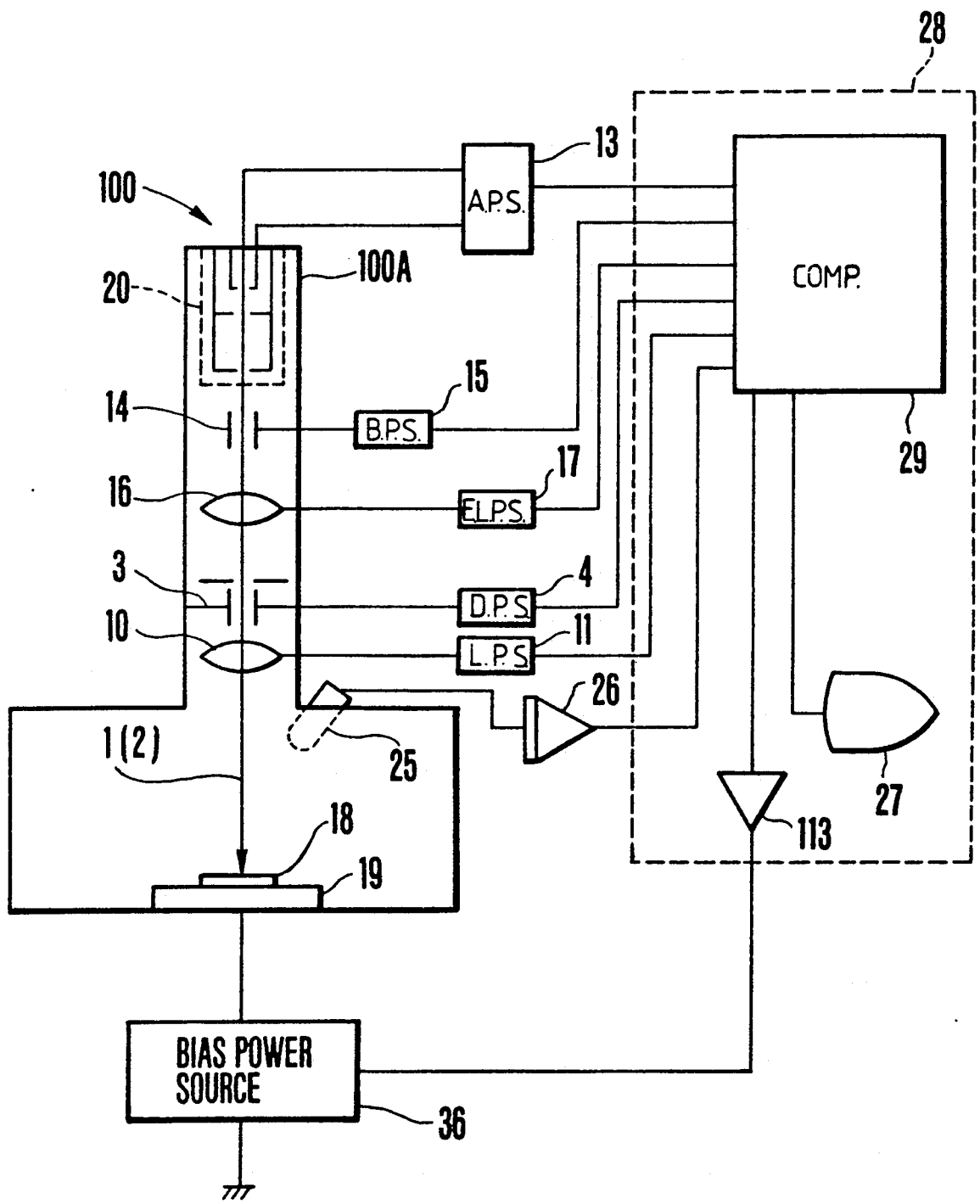
FIG. 20 is a schematic view showing another modification of the apparatus in FIG. 10.

In addition to the above embodiments, a bias power source 36 can be applied to the charge beam radiation apparatus with a single column (FIG. 7), as shown in FIG. 20. Also, bias voltage may be applied to an electrical device as shown in FIGS. 18(a) and 18(b) instead of the direct bias application in FIG. 20.

What is claimed is:

1. A charged beam radiation apparatus comprising:
   auxiliary charged beam emitting means for emitting an auxiliary charged beam having a given acceleration voltage onto a predetermined portion of an electronic device which includes a pattern to be measured; said given acceleration voltage selected to produce a secondary emission ratio of less than 1 to charge said predetermined portion of said electronic device to a negative potential;
   main charged beam emitting means for emitting a main charged beam having an acceleration voltage lower than said given acceleration voltage of said auxiliary charged beam onto said predetermined portion and the vicinity of said predetermined portion to generate secondary electrons;
   secondary electron detecting means for detecting secondary electrons generated from a portion irradiated by said main charged beam to generate a secondary electron signal waveform; and
   means for measuring the size of the pattern to be measured by detecting the edge of said pattern from said secondary electron signal waveform generated by said detecting means.

2. An apparatus according to claim 1, wherein said auxiliary charged beam emitting means and said main charged beam emitting means are constituted by a single column, said single column being adapted to selectively generate one of said main and said auxiliary charged beams under the control of a controller.

3. An apparatus according to claim 1, wherein said auxiliary charged beam emitting means and said main charged beam emitting means are constituted by different columns.

4. An apparatus according to claim 1, further comprising means for applying a bias voltage to said electronic device to be measured to inhibit charge build-up and to reduce the variations in the emission of secondary electrons due to such charge build-up on said electronic device.

5. An apparatus according to claim 4, wherein said bias voltage applying means comprises a power source for directly applying a positive bias voltage to said electronic device to be measured.

6. An apparatus according to claim 4, wherein said apparatus has a stage for holding said electronic device to be measured, said bias voltage applying means comprising a bias voltage source for applying a positive bias voltage to said stage.

7. An apparatus according to claim 4, further comprising control means for controlling said bias voltage to reduce the variation in the emission of secondary electrons due to charge build-up.

8. An apparatus according to claim 7, wherein said secondary electron signal is a waveform, and wherein said waveform can be approximated by a polynomial, said control means controls said bias voltage to minimize the absolute value of the coefficients of said polynomial.

9. An apparatus according to claim 7, wherein said control means includes means for approximating said secondary electron signal waveform through a polynominal for coefficients to be determined and for controlling said bias voltage in such a way that the absolute values of said coefficients of the orders higher than the first order are smaller than a reference value.

10. An apparatus according to claim 4, wherein said bias voltage applying means comprises:
    an electrode mounted through an insulating member on a lower end of a column constituting part of said main charged beam emitting means; and
    means for applying the negative bias voltage to said electrode, said electrode disposed between said electronic device and said secondary electron detecting means.

11. An apparatus according to claim 6, wherein said apparatus includes a stage for holding said electronic device and wherein said electrode is arranged to cover said electronic device, excluding a portion corresponding to a position of said secondary electron detecting means, when said electronic device is placed on said stage.

12. A charged beam radiation apparatus comprising:
    charged beam emitting means for emitting a charged beam having a given acceleration voltage onto a predetermined portion of an electronic device containing a pattern whose size is to be measured;
    secondary electron detecting means for detecting secondary electrons emitted from the portion of said electronic device irradiated by said charged beam to generate a secondary electron signal waveform;
    means for measuring the pattern size by detecting the edge of said pattern from said secondary electron signal waveform obtained from said secondary electron detecting means; and
    means for applying a bias voltage to said electronic device to inhibit charge build up and reduce variations in emission of secondary electrons due to charge build up in said electronic device.

13. An apparatus according to claim 12, wherein said means for applying a bias voltage comprises an electrode mounted through an insulating member on a lower end of a column constituting part of said charged beam emitting means, and means for applying the negative bias voltage to said electrode, and wherein said electrode is disposed between said secondary electron detecting means and said electronic device to be measured.

14. An apparatus according to claim 12, wherein said apparatus has a stage holding said electronic device, said bias voltage applying means comprises a bias voltage power source for applying a positive bias voltage to said stage holding said electronic device to be measured.

15. An apparatus according to claim 12, wherein said charged beam emitting means comprises an acceleration voltage source, a blanker connected to a blanking power source, for performing ON/OFF operation of the beam, a deflection electrode connected to a deflection power source, an objective lens connected to an objective lens power source, and a controller for controlling the generation of said charged beam emitting means.

16. A method of measuring the size of a pattern on an electronic device comprising the steps of:
   bombarding the pattern to be measured with an electron beam having an acceleration voltage at which the secondary electron emission ratio is less than 1 for a predetermined period of time;
   decreasing the acceleration voltage of the electron beam to an acceleration voltage for which the secondary electron emission ratio is approximately 1;
   line-scanning the edges of the pattern to be measured with said electron bean having said decreased acceleration voltage;
   quantizing the secondary electron signals from the edge portions on both sides of the pattern to be measured at a predetermined slice level; and
   determining the pattern size from the distance between the edges ascertained from the quantized secondary electron signals.

17. The method of claim 16 wherein said predetermined time is a time sufficient for the quantity of said secondary electron signal to reach a predetermined value.

18. A method of measuring a pattern size comprising the steps of:
   impressing a bias voltage upon said electronic device in such a way that the background level of a secondary electron signal waveform obtained by scanning the area peripheral to the pattern to be measured on said electronic device becomes uniform;
   detecting the edges of the pattern to be measured from the secondary electron signal waveform in which the secondary electron signals for the edge portions on both sides of the pattern to be measured are quantized at a predetermined slice level; and
   determining the pattern size from the distance between the edges on those two sides.

19. A method according to claim 18, wherein said step of making the background level uniform comprises the steps of:
   taking in a secondary electron signal waveform with said bias voltage set at a predetermined value;
   approximating said waveform through a polynomial for coefficients to be determined by sequentially varying said bias voltage;
   producing from the relationship between said bias voltage and the absolute values of said coefficients, of the orders higher than the first order, a value of said bias voltage at which the absolute values of the coefficients of said orders higher than said first order become smaller than a reference value; and
   setting said bias voltage at said value of the bias voltage at which the absolute values of the coefficients of said orders higher than said first order become smaller than a reference value.

20. A method according to claim 18, wherein the pattern to be measured on said electronic device is bombarded with an electron beam having an acceleration voltage at which the secondary electron emission ratio is less than 1 for a predetermined period of time before taking the secondary electron signal waveform formed by scanning said pattern with a charged beam having a lower acceleration voltage.

21. A method according to claim 20 wherein said predetermined time is a time sufficient for the quantity of said secondary electron signal to reach a predetermined value.

22. A method according to claim 18, wherein said electronic device is a wafer under processing, said pattern to be measured is a pattern formed on an insulating film on said wafer, and said bias voltage is impressed upon the bottom surface of said wafer which is insulated from said pattern to be measured.

23. A method of detecting a pattern comprising the steps of:
   impressing a bias voltage upon the bottom surface of a wafer under processing which is insulated from a pattern to be measured on the top surface of said wafer in such a way that said background level of said secondary electron signal waveform obtained by scanning an area peripheral to said pattern to be measured becomes uniform;
   detecting said maximum and minimum values of the secondary electron signals waveforms resulting from said pattern when said background level is uniform;
   quantizing said secondary electron signal waveforms at a predetermined slice level between said maximum and minimum values; and
   detecting remnants left after etching in pattern portions.

* * * * *

UNITED STATES PATENT AND TRADEMARK OFFICE
CERTIFICATE OF CORRECTION

PATENT NO. : 5,006,795

DATED : April 9, 1991

INVENTOR(S) : Yoshizawa et al

It is certified that error appears in the above-identified patent and that said Letters Patent is hereby corrected as shown below:

Column 1, line 51, delete "1" and insert ---- ----.

Column 5, line 22, delete "pike" and insert ---- spike ----.

Column 5, line 52, before "electron" delete the comma ",".

Column 6, line 15, after "size" insert a period ---- . ----.

Column 6, line 35, delete in its entirety.

Column 6, line 36, delete the indention and insert ---- second electron beam 2 is accelerated at a ----.

Column 8, line 14, after "position" insert a period ---- . ----.

Column 11, line 57, delete "shown" and insert ---- shows ----.

Column 12, line 19, delete in its entirety.

Column 12, line 20, delete the indention and insert ---- secondary electron ----.

Column 13, line 14, after "voltage" delete the comma ",".

In the Claims

Column 15, line 48, after "said" insert ---- secondary electron ----.

UNITED STATES PATENT AND TRADEMARK OFFICE
CERTIFICATE OF CORRECTION

PATENT NO. : 5,006,795

DATED : April 9, 1991

INVENTOR(S) : Yoshizawa et al

It is certified that error appears in the above-identified patent and that said Letters Patent is hereby corrected as shown below:

Column 16, line 19, delete "polynominal" and insert ---- polynomial ----.

Column 16, line 32, delete "6" and insert ---- 10 ----.

Column 17, line 24, delete "bean" and insert ---- beam ----.

Column 17, line 38, delete "said" and insert ---- an ----.

Column 18, line 39, delete "said" and insert ---- the ----.

Column 18, line 40, delete "said" and insert ---- the ----.

Column 18, line 43, delete "said" and insert ---- the ----, same line, delete "the" and insert ---- said ----.

Signed and Sealed this

Twenty-fifth Day of August, 1992

Attest:

DOUGLAS B. COMER

*Attesting Officer*     *Acting Commissioner of Patents and Trademarks*